US 6,647,759 B2

(12) United States Patent
Leverrier et al.

(10) Patent No.: US 6,647,759 B2
(45) Date of Patent: Nov. 18, 2003

(54) SENSOR MICRO-MACHINED WITH ELECTROLYTIC WELDING AND METHOD FOR MAKING SAME

(75) Inventors: Bertrand Leverrier, Montelier (FR); Marie-Dominique Bruni-Marchionni, Coublevie (FR)

(73) Assignee: Thales, Paris (FR)

( * ) Notice: Subject to any disclaimer, the term of this patent is extended or adjusted under 35 U.S.C. 154(b) by 0 days.

(21) Appl. No.: 10/110,065
(22) PCT Filed: Aug. 7, 2001
(86) PCT No.: PCT/FR01/02568
§ 371 (c)(1), (2), (4) Date: Apr. 8, 2002
(87) PCT Pub. No.: WO02/15257
PCT Pub. Date: Feb. 21, 2002

(65) Prior Publication Data
US 2002/0152798 A1 Oct. 24, 2002

(30) Foreign Application Priority Data
Aug. 11, 2000 (FR) .............................................. 00 10582

(51) Int. Cl.⁷ ................................................. G01N 7/00
(52) U.S. Cl. ........................................ 73/31.05; 73/756
(58) Field of Search .......................... 205/114; 73/31.05, 73/31.06, 720, 726, 756, 754

(56) References Cited

U.S. PATENT DOCUMENTS

| 4,442,716 A | * | 4/1984 | Coe et al. ....................... 73/756 |
| 4,746,893 A | * | 5/1988 | Shak .............................. 338/5 |
| 5,029,478 A | * | 7/1991 | Wamstad ....................... 73/706 |
| 5,049,421 A | * | 9/1991 | Kosh ......................... 428/34.4 |
| 5,290,423 A | | 3/1994 | Helber, Jr. et al. |
| 5,594,819 A | * | 1/1997 | Narendran et al. ........... 385/12 |
| 5,645,707 A | | 7/1997 | Omoto |
| 5,693,208 A | | 12/1997 | Paulet |
| 5,706,252 A | | 1/1998 | LeVerrier et al. |
| 5,773,889 A | | 6/1998 | Horine et al. |
| 5,948,991 A | * | 9/1999 | Nomura et al. ................. 73/727 |
| 5,998,864 A | | 12/1999 | Khandros et al. |
| 6,122,974 A | * | 9/2000 | Sato et al. ..................... 73/754 |
| 2002/0029639 A1 | * | 3/2002 | Wagner et al. |
| 2002/0078755 A1 | * | 6/2002 | Imai et al. |

FOREIGN PATENT DOCUMENTS

| JP | 09 005187 | 1/1997 |
| JP | 10 153508 | 6/1998 |
| WO | 99 54166 | 10/1999 |

OTHER PUBLICATIONS

U.S. patent application Ser. No. 10/089,974, filed Apr. 8, 2002, pending.
U.S. patent application Ser. No. 10/110,065, filed Apr. 8, 2002, pending.

* cited by examiner

Primary Examiner—Helen Kwok
Assistant Examiner—Charles Garber
(74) Attorney, Agent, or Firm—Oblon, Spivak, McClelland, Maier & Neustadt, P.C.

(57) ABSTRACT

A sensor of physical quantities, such as a pressure sensor or an acceleration sensor, and more specifically to the mounting of the active part of the sensor on a base bearing connection pins. An active part of the sensor includes, for example, micro-machined silicon wafers bearing electronic elements, electrical conductors, and connection pads. A base is also prepared, provided with pins whose upper ends are spatially arranged, with each pin facing a respective connection pad. The face bearing the connection pads is applied to the upper part of the pins, and the unit is dipped into an electrolytic bath to deposit metal that rigidly solders the pins to the connection pads. Preferably, the conductive parts, pins, and connection pads of the unit are then covered with an insulator to prevent electrical leakage between pins subjected to different potentials.

7 Claims, 2 Drawing Sheets

SENSOR MICRO-MACHINED WITH ELECTROLYTIC WELDING AND METHOD FOR MAKING SAME

The invention relates to the mounting of sensors of physical quantities capable of working in harsh environments.

The mounting generally consists of the transfer of a micro-machined sensor to a base provided with electrical connection pins. The sensor is made, for example, out of several machined silicon wafers comprising mechanical elements (diaphragms, beams, seismic masses, etc), electronic elements (capacitor plates or strain gauges in particular), and metal contact pads used for electrical connection with the pins of the base when the sensor is fixed to the base.

Classically, the sensor is bonded or brazed by its rear face to the base, in a central part of this base that is surrounded by connection pins that go through the base. The connection pads of the sensor, on the front face of this sensor, are connected by bonded wires between the connection pads and the tips of the connection pins that emerge from the surface of the base.

This approach is costly, in terms of both manufacturing time and the cost of the automatic soldering machine.

The invention is aimed at proposing a less costly solution that has good qualities of mechanical resistance and greater compactness, and can be used in a large number of applications, including especially pressure sensors and accelerometers.

The invention proposes a sensor of physical quantities comprising at least one micro-machined wafer provided with conductive connection pads on a main face, and a base provided with conductive connection pins, the main face being turned towards the base and each connection pad facing a corresponding pin end, an electrolytic deposit of metal or metals coating the end of each pin and the corresponding connection pad so as to set up a rigid fastening between this end and the pad.

The term "electrolytic deposit" is understood to mean a metal deposit (an alloy of metals or the deposition of several metals) on a conductive zone, obtained by the migration of metal ions coming from a liquid solution. The migration may be prompted either by the passage of an electrical current (in a classic electrolytic bath with current lead-in electrodes), or by chemical reaction (using what is called electroless deposition).

The method of manufacture according to the invention therefore consists in:

preparing an active sensor part and a base, the active part comprising at least one wafer provided with connection pads on a front face, and the base being provided with conductive pins whose ends are arranged spatially so that each end leans against a respective pad of the wafer when the front face of this wafer is brought closer to the base, holding the plate against the base and dipping the plate and at least the pin ends into an electrolytic bath, and carrying out an electrolytic deposition of conductive metal on the pin ends and the pads with a metal thickness sufficient to provide for rigid fastening between the pins and the pads by the deposited metal.

The electrolytic deposition on the pads and on the pins achieves, so to speak, a solder with soldering metal between these pads and the pins, and the resistance of this solder in a harsh environment is far higher than the resistance that would be obtained if a simple conductive bonder were used between the pins and the pads. Furthermore, this joining is done without any need take the pads to high temperature as would be the case with true soldering or brazing. Furthermore, the operation of fastening by electrolytic deposition is done without mechanical strain between the pads and the pins.

This method can be implemented collectively for batches of sensors, without involving costly machines such as those used to carry out automatic <<wire-bonding>>.

Above the surface of the base, the pins may have a substantial height, for example a height of some millimeters for a base with a diameter of one centimeter, so that the sensor is suspended in a relatively flexible way owing the flexibility proper to the pins. It is therefore less subjected to the strains that may be borne by the base, especially the strains due to heat expansion, impacts, vibration, etc.

Preferably, the connection pins and the connection pads lined with electrolytic metal are lined with an insulating layer to eliminate the risks of shorting or current leakage paths between pins when they are in a liquid or gas environment that is not perfectly insulating (moist air or saline air or water for example).

The insulation layer may be produced by electrolytic oxidization or nitrization, or by a second deposit of conductive metal and an oxidization or nitrization of this second deposit. It can also be made by the deposition of mineral insulator by chemical decomposition, possibly plasma-assisted. For less severe environments, the deposition of an insulating organic layer may be considered.

Other features and advantages of the invention shall appear from the following detailed description made with reference to the appended drawings, of which:

The invention shall be solely described with reference to a pressure sensor that has to work in a harsh environment, for example a sensor of the pressure of exhaust gases from an internal combustion engine or a pressure sensor placed within the cylinder of such an engine. The environment therein is harsh because of the very high temperatures (several hundreds of degrees Celsius) and the noxiousness of the surrounding environment (in terms of corrosive gases). The invention can be applied however to other sensors.

Figure 1:
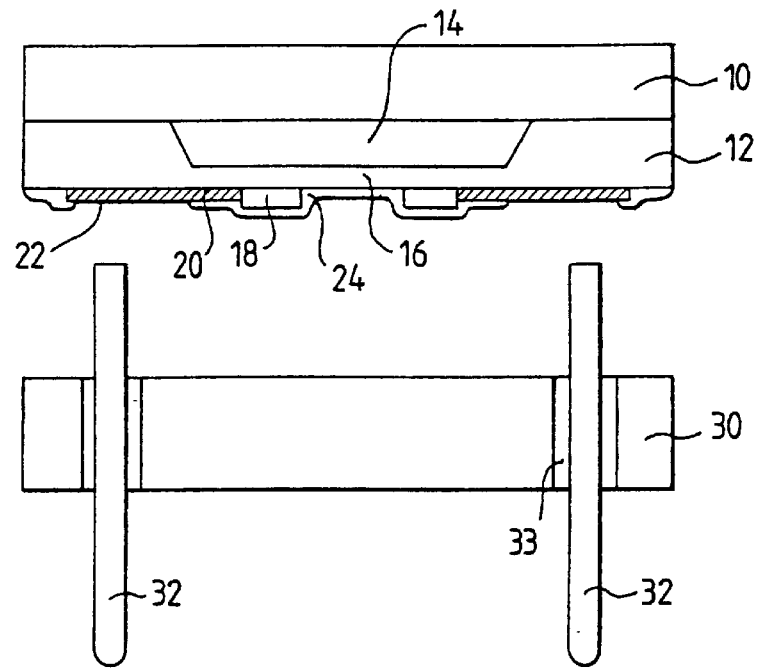
FIG. 1 shows a phase of the method of manufacture according to the invention

FIG. 1 shows the sensor according to the invention with an active part and a base, in a phase that precedes the fastening of the active part to the base. The active part of the sensor, in this example, is made out of two soldered silicon wafers 10 and 12, machined so as to demarcate a cavity 14 closed by a thin silicon diaphragm 16. The wafer 10 could be made of glass.

On the diaphragm 16, electronic elements 18 needed to detect the deformations of this diaphragm are formed by means of microelectronic manufacturing methods. In one example, these elements are strain gauges directly formed in the silicon (by the implantation of appropriate dopants in the silicon) or formed in a silicon layer separated from the silicon substrate by an insulating layer (this is the SOI or silicon-on-insulator structure). For very harsh environments, these gauges may be made on the diaphragm inside the cavity 14. If the environment is less difficult, they may be formed outside the cavity 14. The gauges are sensitive to the deformations of the diaphragm prompted by the pressure variations to be measured.

Electrical connections 20 used for the power supply of the gauges and for the transmission of measurements made on these gauges are formed on the active part of the sensor. On a front face of the active part of the sensor, these connections lead to connection pads 22 which are conductive metal surfaces used for the electrical connection with external pins. The front face or main face of the active part of the sensor is the one facing downwards in FIG. 1. The front face is generally protected by a passivation layer 24 (made of silicon oxide or nitride for example) that lines the entire surface except for the connection pads 22 or at least their central part.

For the mounting of the active part of the sensor on a base, a base 30 is made with metal connection pins 32 going through this base. The number of these pins 32 is at least equal to the number of connection pads present on the sensor and necessary for the working of the sensor. The upper part of the pins is located on top of the base and goes beyond the surface of the base. The lower part descends beneath the lower surface of the base and could be plugged for example into a female connector or into holes of a printed circuit, or bonded to individual conductive wires, etc.

The base may be insulating or conductive but, in the latter case, it must be planned that an insulator 33 (for example made of glass in the case of a metal base) will fill the passages into which the pins are inserted, in order to electrically insulate the pins from one another. In one embodiment, the base is a metal alloy such as Kovar, with glass-lined via holes. It could be made of insulating ceramic or even plastic for environments at moderate temperatures.

The spatial arrangement of the pins on the base is such that, when the front face of the sensor (the lower face in FIG. 1) is brought closer to the upper part of the base, each pin rests so that it is in direct contact (mechanical or electrical contact) respectively with a connection pad 22 of the sensor.

In the method according to the invention, the active part of the sensor as well as the upper part of the pins are then dipped into an electrolytic bath while they are kept in contact with the pins, so that a conductive metal deposit is formed, by electrolytic migration, both on the pads and on the upper part of the pins.

The operation of electrolytic deposition (with or without electrical current to carry out the electrolysis) is continued until the metal thickness deposited is sufficient to obtain rigid mechanical bonding between each of the pins and a corresponding pad of the active part of the sensor.

Figure 2:
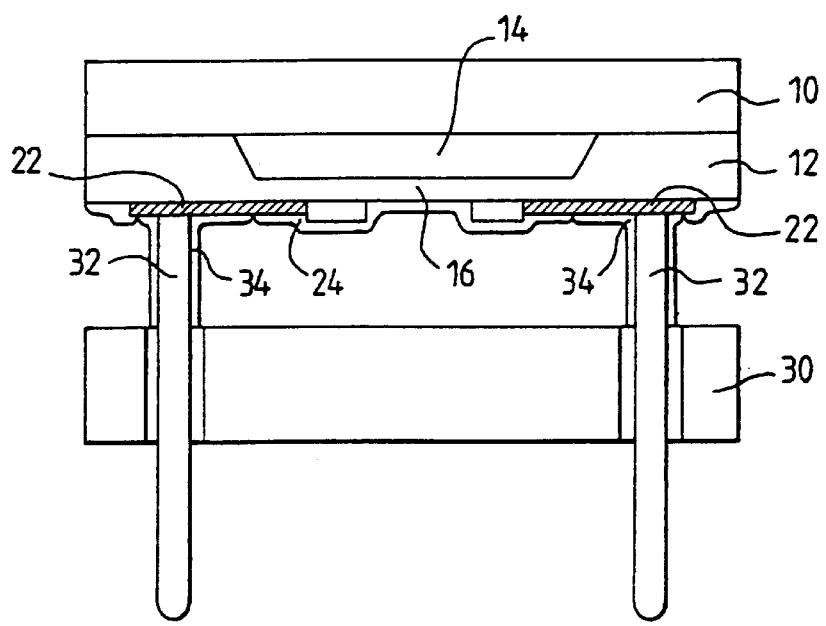
FIG. 2 shows a subsequent phase of the method

FIG. 2 shows the sensor thus rigidly fixed to its base. The part of the pad 22 and of the pins 32 that had been in contact with the electrolytic bath is entirely lined with a layer 34 of deposited metal. The metal has not been deposited on the non-conductive part of the sensor (the passivation layer 24 especially). In the example shown, the entire pin part emerging out of the base has been lined because this entire part has been dipped into the bath, but this is not obligatory. It is enough that the pin zone in the immediate vicinity of the connection pad should be dipped into the bath.

The metal deposited by electrolysis may be especially copper or gold, or nickel, but other metals are possible. Several metals may be deposited. An alloy of metals or a co-deposition of two or more metals may also be envisaged. The connection pads may be made of gold or aluminium other metals or a combination of metals (sometimes with several metal layers superimposed). If the deposit is made by classic electrolysis with the passage of current into a solution containing metal ions, it is seen to it that all the pins are connected together during the time of the electrolysis (preferably through the rear of the base, namely through a part that is not dipped into the electrolytic bath). An appropriate difference in electrolysis potential is applied between these pins and another electrode dipped into the bath.

An electroless deposit is also possible. In this case, the electrolysis occurs by simple chemical reaction between the pins or connection pads and the ion solution of the electrolytic bath, without the application of external potential differences.

The thickness of metal deposit on the pins may be equal to some tens of micrometers or more to provide for rigid mechanical soldering between the pins and the surface of the sensor.

The upper part of the pins, going beyond the top of the upper surface of the base, may have a very small length, or else a substantial length to provide for a certain flexibility of bonding between the sensor and its base, this flexibility being due to the natural flexibility of the pins, which is especially great as the pins are thinner and as their emerging part is longer.

During the manufacture of the base bearing the through pins, it must be seen to it that the pin ends are all located in one and the same plane so that they rest uniformly on all the connection pad of the sensor (on the assumption, which is generally true, that all the pads are in a same plane). If, however, a small gap were to remain between a pin and a pad, it would be soon be filled with the material of the electrolytic deposit.

After the electrolytic deposition which solders the sensor to the pins of the base, it is preferable to provide for an additional operation to protect all the conductive part of the sensor, the base and the pins, by means of an insulating layer. This layer acts as a passivation layer, preventing especially leakages of electrical current between the pins when these pins are in an atmosphere that is not perfectly insulating (such as a saline air environment, etc.). Not only can this passivation layer prevent electrical leakages through the ambient air but its also prevents a penetration of moisture toward the conductive parts of the sensor. The nature of this layer is obviously a function of the harshness of the ambient conditions: a mineral layer will be necessary for the high temperatures, an organic layer may be sufficient if the temperature remains below 200° C. for example. The mineral layers that may be deposited are for example silicon oxide, silicon nitride, silicon carbide and even diamond. As an alternative, an organic layer could be made of silicone or parylene.

A particularly efficient method for harsh environments may consist especially of an electrolytic oxidization or nitrization of the conductive metal surface of the pins and pads of the sensor. In one embodiment, the metal layer 34, used to bond the sensor to the pins, is electrolytically oxidized or nitrized by dipping the sensor into a new electrolytic bath appropriate to this oxidization or nitrization. In another embodiment, a second metal layer is deposited by electrolysis, on top of the layer 34 (in particular, if the layer 34 is not easy to oxidize or nitrize by electrolytic means, or if the oxidization or nitrization results in a layer that is insufficiently resistant to aggression from the environment, it may be preferred to deposit a second metal layer that is easier to oxidize or nitrize); the second layer may be made of nickel or tantalum for example. Then, the second metal layer is oxidized or nitrized either in an oxidizing or nitrizing gaseous atmosphere or by dipping the sensor and the pins into an oxidizing or nitrizing chemical or electrolytic bath. In a third embodiment, the insulating layer is formed by an electrolytic deposit of insulator (metal oxide or metal nitride).

Finally, if it is easier, the passivation layer may be formed in a more classic way by a deposit of mineral insulating layer (silicon oxide of silicon nitride) by plasma-assisted gas phase deposition (silicon oxide or silicon nitride). In this case, naturally the additional layer will not be limited to covering the apparent conductive part of the sensor. It covers all the parts exposed to the source of deposition compound in the deposition reactor.

The protective insulating layer thus deposited can be used especially to protect the sensor by means of an insulating oil bath and a metal diaphragm as is done occasionally in the prior art to prevent electrical leakage between pins taken to different potentials. This type of assembly is costly and the presence of this oil bath modifies the characteristics proper to the sensor: for example, in the case of a pressure sensor, the external pressure is transmitted through the oil bath, thus generating measurement errors that are difficult to compensate for.

Figure 3:
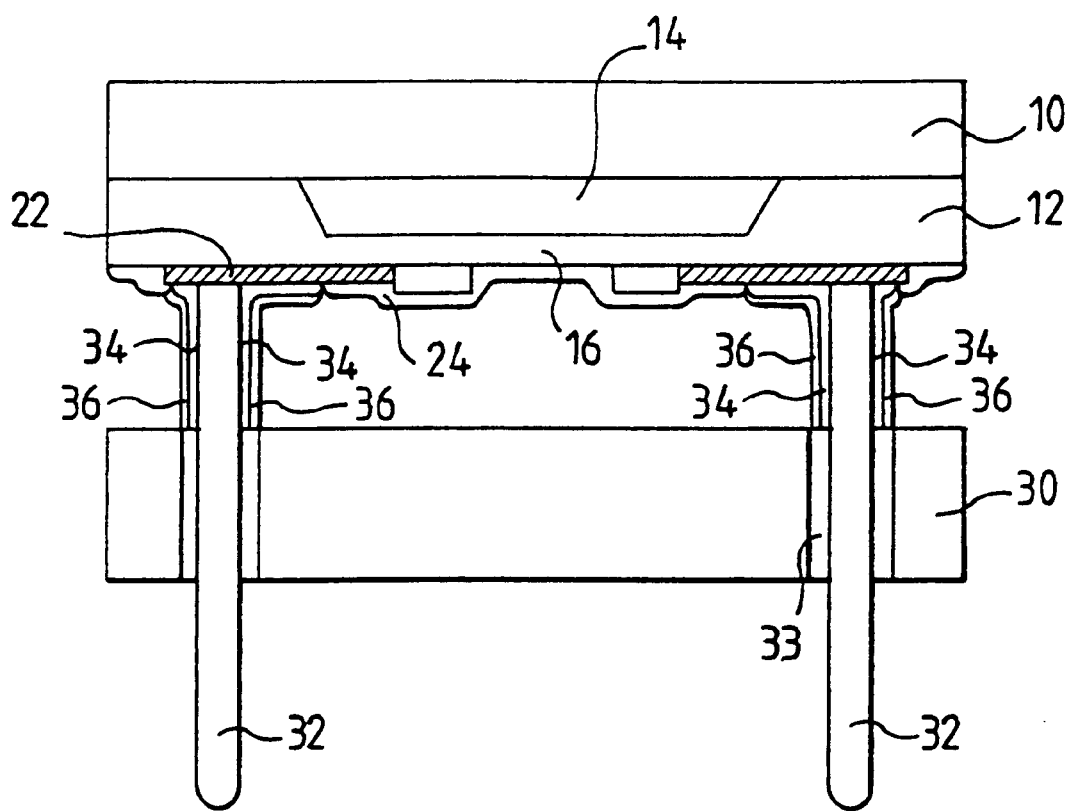
FIG. 3 shows the sensor according to the invention at the end of the method of manufacture.

FIG. 3 shows the sensor provided with an additional protection layer 36 on all the conductive parts.

The figures show straight conductive pins. In certain cases it is possible to envisage shapes of pins that are not straight and, in particular, are twisted so as to increase their flexibility with respect to motions that are both parallel to the plane of the base and perpendicular to this plane. The advantage of this is that it facilitates the application of the pin ends against the conductive pads during electrolysis. This subsequently also has the advantage of more efficiently uncoupling the sensor from its base, thus preventing the transmission of excessive forces or undesirable vibrations to the active part which, by its very nature, is particularly sensitive to mechanical strains.

The invention is especially applicable to sensors of pressure, forces, acceleration and temperature, working in harsh environments.

What is claimed is:

1. Method for manufacture of a sensor of physical quantities, comprising:

preparing an active sensor part and a base, the active sensor part including a wafer provided with connection pads on a front face, and the base provided with conductive pins each having a pin end arranged spatially so that each pin end rests against a respective connection pad of the wafer when the front face of the wafer is brought closer to the base;

holding the wafer against the base;

dipping the wafer and at least the conductive pin ends into an electrolytic bath; and carrying out an electrolytic deposition of conductive metal or conductive metals on the conductive pin ends and the connection pads with a metal thickness sufficient to provide for rigid fastening between the conductive pins and the connection pads by the deposited metal.

2. Method according to claim 1, wherein the electrolytic deposit is made by migration of metal ions coming from a liquid solution, with a passage of electrical current into the solution.

3. Method according to claim 1, wherein the electrolytic deposit is an electroless deposit made by migration of metal ions coming from a liquid solution, without passage of electrical current into the solution.

4. Method according to claim 1, wherein the connection pins and the connection pads lined with electrolytic metal are lined with an insulator layer.

5. Method according to claim wherein the insulator layer is obtained by one of electrolytic oxidization or nitrization of the metal deposited by electrolytic means, and a second conductive metal deposit and an oxidization or nitrization of the second deposit.

6. Method according to claim 5, wherein the insulator layer is obtained by deposition of mineral insulator by chemical decomposition.

7. Method according to claim 6, wherein the chemical decomposition is plasma-assisted.

* * * * *